United States Patent [19]

Jordan

[11] Patent Number: 5,218,249

[45] Date of Patent: Jun. 8, 1993

[54] HIGH SPEED, LOW FORWARD VOLTAGE DROP, SCR

[75] Inventor: Mark Jordan, Manchester, N.H.

[73] Assignee: Unitrode Corporation, Billerica, Mass.

[21] Appl. No.: 755,081

[22] Filed: Sep. 5, 1991

[51] Int. Cl.⁵ .................. H03K 17/60; H03K 3/26
[52] U.S. Cl. ............................... 307/631; 307/284; 307/289; 307/638
[58] Field of Search ............... 307/284, 289, 638, 631, 307/639

[56] References Cited

U.S. PATENT DOCUMENTS

| | | | |
|---|---|---|---|
| 3,619,652 | 11/1971 | Ogle | 307/305 |
| 3,675,045 | 7/1972 | Mullaly | 307/289 |
| 4,271,364 | 6/1981 | Leonard | 307/289 |
| 4,613,767 | 9/1986 | Holland | 307/288 |
| 4,845,391 | 7/1989 | Gukzynski | 307/631 |

Primary Examiner—John Zazworsky
Attorney, Agent, or Firm—Weingarten, Schurgin, Gagnebin & Hayes

[57] ABSTRACT

A silicon controlled rectifier device including an SCR portion controlled by an input voltage signal to a voltage comparator and having a latching circuit to permit the SCR portion to remain in the conducting state once switched even in the absence of the input voltage signal. Such a device is especially useful when a narrow input voltage signal is used to switch the SC portion into its conducting state.

7 Claims, 2 Drawing Sheets

HIGH SPEED, LOW FORWARD VOLTAGE DROP, SCR

BACKGROUND OF THE INVENTION

Silicon controlled rectifiers (SCRs) have many applications in electronics design, because of their ability to control large amounts of current with a control signal. It is desirable in some applications for the SCR circuit to have a relatively small voltage drop when in the conducting state. Such a low forward-voltage drop SCR is disclosed in U.S. Pat. No. 4,613,767 to Holland. Still higher performance is needed in certain applications. Such higher performance may incorporate a faster response time and the ability to adjust the temperature coefficient of the holding current; the current required to maintain the SCR in the conducting state.

The present invention relates to a high speed, low forward-voltage drop, SCR device which has the above desired features.

SUMMARY OF THE INVENTION

The invention relates to silicon controlled rectifier device including an SCR portion controlled by an input voltage signal to a voltage comparator. The device also includes a latching circuit to permit the SCR portion to remain in the conducting state once switched, even in the absence of the input voltage signal, if the current through the SCR portion is greater than a predetermined threshold current. The SCR portion will remain conducting until the current through the SCR portion decreases below a threshold value. Such a device is especially useful when a narrow input voltage signal is used to switch the SCR into its conducting state.

In the prior art, the threshold level was difficult to adjust and PNP transistors, which were typically in the SCR circuit, caused the SCR to respond slowly. The present design provides the electronic circuit designer with an SCR device which is more accurate, faster and easily interfaced to high speed logic. The present design both overcomes the adjustment difficulties and responds approximately ten times faster than the prior art circuits.

DESCRIPTION OF THE DRAWINGS

The invention will be more fully understood from the following detailed description taken in conjunction with the accompanying drawings in which.

DETAILED DESCRIPTION OF THE INVENTION

Figure 1:
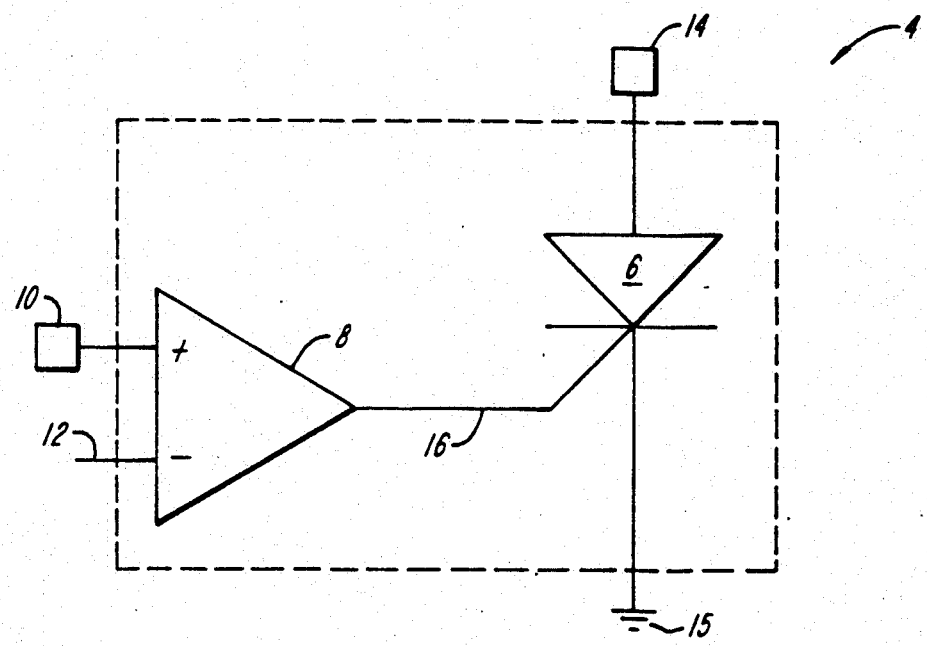
FIG. 1 is a simplified diagram of a high speed, low forward voltage SCR.
Figure 2:
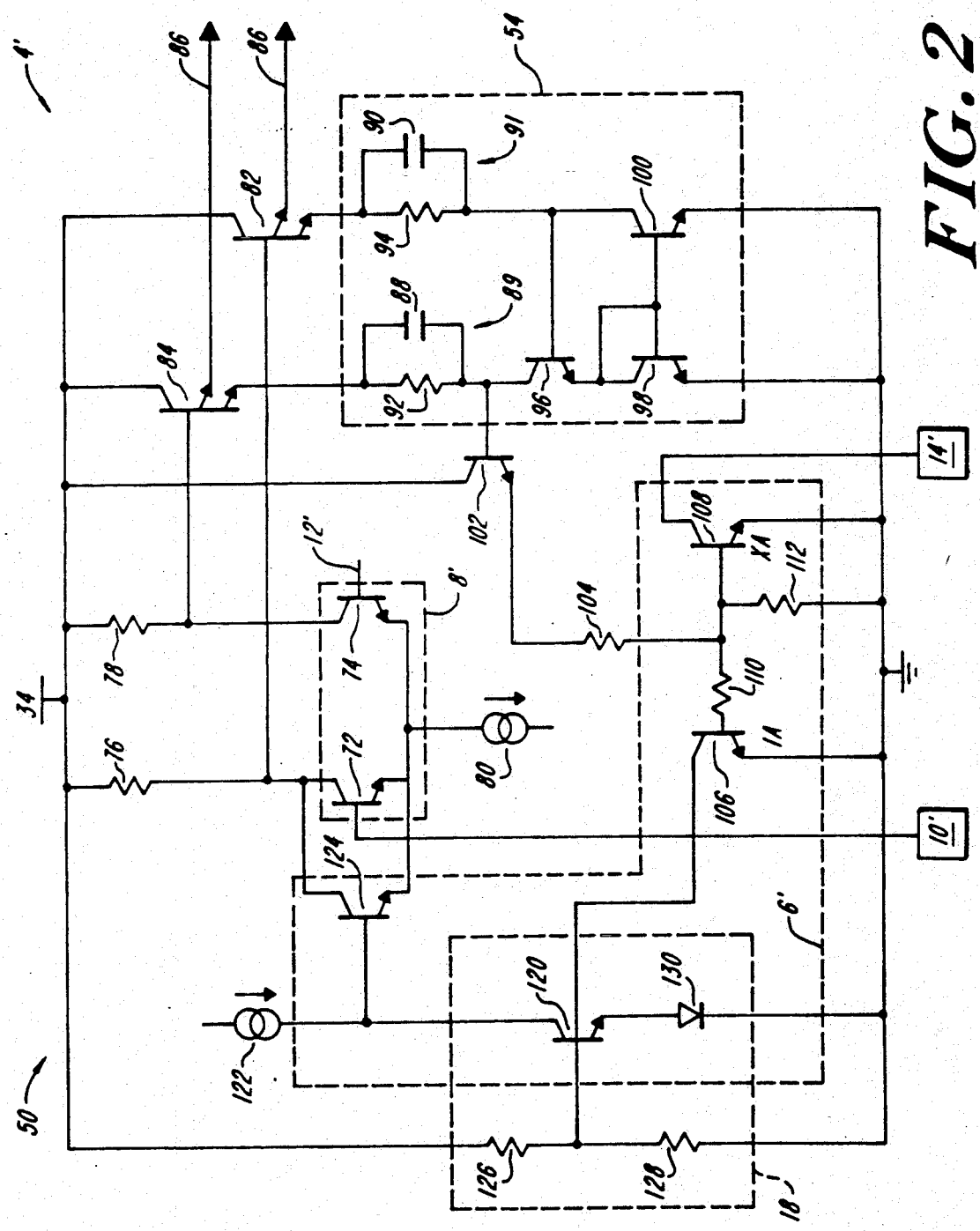
FIG. 2 is a detailed circuit diagram of a high speed, low forward voltage SCR.

In brief overview, an SCR device 4, shown in FIG. 1, includes a voltage comparator 8 controlling an SCR 6, which in its most basic form resembles a voltage controlled latching switch. An SCR control signal voltage is applied to one input terminal 10 of the comparator 8. When this control voltage is greater than a reference voltage signal applied to a second input terminal 12 of the comparator 8, the comparator 8 generates a high output signal on its output terminal 16, enabling SCR 6. A device in communication to the SCR input terminal 14 will experience a minimal resistance through the SCR device 4, to ground 15 in this configuration, as long as the SCR control signal voltage level exceeds the reference voltage. When the SCR input signal voltage level falls below the reference voltage level, enough current flows from the SCR input terminal 14 through the SCR 6 to ground 15 to keep the SCR 6 forward biased and conducting. When the current flowing through the SCR 6 from the SCR input terminal 14 to ground 15 goes below a threshold current level, the SCR 6 will switch off. Referring now to FIG. 2, an embodiment of a high speed, low forward voltage SCR device 4', includes a shutdown comparator portion 8', an SCR portion 6', a current comparator portion 18 and a voltage level shifting and maximum drive current determining portion 54. The shutdown comparator portion 8' includes a differential pair of transistors 72,74. The base of transistor 72 is connected to the SCR control signal terminal 10', to which is applied an SCR control signal. The base of transistor 74 is connected to a reference voltage 12' which determines the threshold value at which the comparator 8' will switch and generate an output. The emitters of the transistors 72,74 are connected together through a current source 80, while the collectors of the transistors 72,74 are connected through resistors 76,78 respectively to the power supply by way of power supply terminal 34. Resistors 76 and 78 are equal.

When a low SCR control signal applied to the SCR control signal terminal 10' is below the voltage applied to the reference terminal 12', the base voltage of transistor 74 is greater than the base voltage of transistor 72. As a result, there is greater current flow through transistor 74 than transistor 72 and hence there is a greater voltage drop across resistor 78 than resistor 76. This produces a lower base voltage on transistor 84 than on transistor 82 and hence a higher emitter voltage on transistor 82 than on transistor 84. The voltage difference between the two emitter voltages may supplied to ECL differential logic through a pair of leads 86, one lead of the pair connected to an emitter of its respective transistor 82, 84.

The differential voltage produced across the emitters of transistors 82,84 is level shifted and converted to a single ended voltage level measured relative to ground by the level shifting portion 54 which includes transistors 96,98 and 100 and two RC networks 89,91. The current through transistor 82 passes through the RC network 91 including resistor 94 and capacitor 90 (the capacitor providing a low impedance path at high frequencies), with the resulting voltage drop being applied to the base of transistor 96. The collector of transistor 96 is connected to the emitter of transistor 84 through RC network 89 including resistor 92 and capacitor 88. As a result, the current through transistor 96 mirrors the current through transistor 82. A current mirror of transistors 96,98 and 100 controls the current flow through resistors 92 and 94 so that the voltage drop across resistor 92,94 is equal.

The higher voltage drop across resistor 92 results in a low voltage being applied to the base of transistor 102, switching it off. The switching off of transistor 102, in turn, switches off transistors 106 and 108 of the SCR circuit 6'. In the embodiment shown, resistor 104 is the base current limiting resistor for transistors 106 and 108, while resistor 110 provides additional base current limitation to transistor 106 in the event that transistor 106 saturates. The maximum drive current ($I_{drive}$) into the bases of transistors 106,108 is limited, in part by resistor 104 and is given by the expression:

$$I_{drive} = I \frac{R_{76}}{R_{104}}$$

where I is the current flowing through current source 80. Resistor 112 is the pull-down resistor for the bases of both transistor 106 and output switching transistor 108. The switching off of output switching transistor 108 results in the switching off of SCR portion 6', which then appears as a high impedance to the SCR input terminal 14'.

Conversely, when the SCR control signal on terminal 10' is high, the current flow through transistor 72 is greater than the current flow through transistor 74 and hence the voltage drop across resistor 76 is greater than the voltage drop across resistor 78. This increased voltage drop across 76 means that transistor 82 has a lower base voltage than transistor 84. As a result, transistor 102 switches on, in turn, switching on transistors 106,108. The switching on of output switching transistor 108 grounds SCR input terminal 14' and the SCR portion 6' appears as a low impedance to the SCR input terminal 14'.

Once transistors 106,108 switch on and the current through output switching transistor 108 exceeds the holding current, the base of transistor 120 in the current comparator portion 18 is brought low by the current through transistor 106, which proportionally mirrors the holding current, switching it off. The holding current ($I_{holding}$) which causes transistor 120 to switch and remain switched is given by the expression:

$$I_{holding} = X \left( V_{supply} \frac{R_{128}}{R_{126} + R_{128}} - 2V_{be} \right) \left( \frac{R_{128} + R_{126}}{R_{128} R_{126}} \right)$$

where X is the emitter scaling factor between transistors 106 and 108, $V_{supply}$ is the supply voltage to the circuit applied at terminal 34, and $V_{be}$ is the base-emitter potential.

Once the holding current exceeds the set threshold, transistor 120 switches off, switching on holding transistor 124, which causes the base voltage of transistor 82 to be low. This is equivalent to the high SCR control signal on SCR control signal input 10' which caused the comparator 8' to generate a differential signal originally. Therefore, regardless of the voltage on the SCR control voltage terminal 10', the SCR portion remains latched in the enabled state. This means a narrow control pulse can be used to switch the SCR device 4' on, and the SCR device 4' will remain on as long as the holding current through output switching transistor 108 exceeds the threshold value. In the absence of a high input signal on the SCR control signal input 10', the reduction of the holding current below the threshold value causes holding transistor 124 to switch off thereby permitting the SCR 4' to return to the non-conducting state. The SCR device 4' just described permits narrow control signals to switch on the SCR device and has a low voltage drop (<200 milliVolts) in the conducting state. The output switch, once switched, will remain on until the holding current decreases to below the threshold level.

It should also be noted that the current comparator portion 18, including a voltage divider of resistors 126,128 and a current comparator of transistor 120 and diode 130, is designed to provide the holding current threshold and has the capability of having a zero temperature coefficient. Since in integrated circuit diffused resistors have a positive temperature coefficient and the Vbe has a negative temperature coefficient, the holding current first order temperature coefficient can easily be adjusted to a zero or a non-zero value as determined by the expression defining the change in holding current with temperature ($dI_{holding}/dT$):

$$\frac{dI_{holding}}{dT} = X \frac{-\left(\frac{2dV_{be}}{dT} + \frac{I_{holding}}{X} \frac{dR}{dT}\right)(R_{126} + R_{128})}{R_{126} R_{128}}$$

where dR/dT is the resistor temperature coefficient, and $dV_{be}/dT$ is the Vbe temperature coefficient. To achieve a zero temperature coefficient the following relationship must also hold:

$$\frac{2dV_{be}}{dT} + \frac{I_{holding}}{X} \frac{dR}{dT} = 0$$

Thus the SCR device 4' disclosed herein not only is capable of being switched by a short duration pulses but it is also temperature compensated and has a low forward voltage drop.

It should be noted that in the typical non-complementary bipolar process used to fabricate the device, NPN transistors are fifty to one hundred times faster than PNP transistors. Hence, the all NPN implementation used in the present invention equates to a 30 nsec. response time compared to the 400 nsec. response time typically achieved by the prior art.

Other variations are possible within the scope of the claims and it is the intent to limit this application only by the scope of the claims.

I claim:

1. A silicon controlled rectifier device comprising:
   a voltage comparator having an input terminal and an output terminal;
   an SCR circuit portion having an SCR circuit portion input terminal, an SCR circuit portion output terminal, and an SCR circuit portion switching control terminal, said SCR circuit portion switching control terminal in electrical communication with said output terminal of said voltage comparator; and
   a current sensitive latching circuit having an input terminal and an output terminal, said input terminal of said current sensitive latching circuit in electrical communication with said SCR circuit portion and responsive to current flow through said SCR circuit portion and said output terminal of said current sensitive latching circuit in electrical communication with said SCR circuit portion switching control terminal,
   said voltage comparator controlling the switching of said SCR circuit portion into a conductive state, in response to a voltage applied to said voltage comparator input terminal, thereby permitting current to flow through said SCR circuit portion and permitting said current sensitive latching circuit to maintain said SCR circuit portion in said conductive state, as long as current flowing through said SCR circuit portion is greater than a predetermined value.

2. The silicon controlled rectifier device of claim 1 wherein said voltage comparator further comprises a voltage comparator current terminal in electrical communication with a current source, wherein said voltage comparator output terminal comprises a first differential output terminal and wherein said current sensitive latching circuit comprises:

a holding transistor having a first terminal, a second terminal and a third terminal, one of said first terminal and said second terminal of said holding transistor in electrical communication with said voltage comparator first differential output terminal and the other of said first terminal and second terminal of said holding transistor in electrical communication with said voltage comparator current terminal; and a current comparator portion having a input terminal and an output terminal, said current sensitive latching circuit output terminal comprising said current comparator portion output terminal and said current sensitive latching circuit input terminal comprising said current comparator portion input terminal, said current comparator portion input terminal in electrical communication with said SCR circuit portion and said current comparator portion output terminal in electrical communication with said third terminal of said holding transistor, said current comparator portion producing a current comparator portion output signal on said current comparator portion output terminal in response to current flow through said SCR circuit portion.

3. The silicon controlled rectifier device of claim 2 wherein said current comparator portion comprises:

a current comparator having a first terminal, a second terminal and a reference terminal; and a voltage divider having a first lead, a second lead and a divider lead, wherein said first lead of said voltage divider is in electrical communication with a power supply and said second lead of said voltage divider is in electrical communication with ground, wherein said output terminal of said current comparator portion comprises said first terminal of said current comparator and said second terminal of said current comparator is in electrical communication with ground, and wherein said input terminal of said current comparator portion comprises said reference terminal of said current comparator and said reference terminal of said current comparator is in electrical communication with said divider lead of said voltage divider.

4. The silicon controlled rectifier device of claim 3 wherein said current comparator comprises:

a diode having a first terminal and a second terminal; and a current comparator transistor having a first terminal, a second terminal and a third terminal, said first terminal of said current comparator transistor in electrical communication with said first terminal of said diode, said second terminal of said diode being in electrical communication with ground and said second terminal of said current comparator transistor in electrical communication with said third terminal of said holding transistor, wherein said third terminal of said current comparator transistor is in electrical communication with said divider lead of said voltage divider and in electrical communication with said SCR circuit portion.

5. The silicon controlled rectifier device of claim 3 wherein said SCR circuit portion comprises:

an output switching transistor having a first terminal, a second terminal and a third terminal, one of said first terminal and said second terminal of said output switching transistor being in electrical communication with ground, wherein said SCR circuit portion input terminal comprises the other of said first terminal and said second terminal of said output switching transistor, and said third terminal of said output switching transistor being in electrical communication with said reference terminal of said current comparator portion.

6. A silicon controlled rectifier device comprising:

a voltage comparator having a control input terminal, a reference input terminal and a control output terminal;

an SCR circuit portion having an SCR input terminal, an SCR output terminal and an SCR switching control terminal, said SCR switching control terminal in electrical communication with said voltage comparator control output terminal; and a current sensitive latching circuit having a latching input terminal and a latching output terminal, said latching input terminal in electrical communication with one of said SCR output terminal and said SCR input terminal and said latching output terminal in electrical communication with said SCR switching control terminal, said voltage comparator providing a control signal at said control output terminal in response to a signal applied to said voltage comparator control input terminal, said control signal causing said SCR circuit portion to switch into a conductive state so as to permit current to flow between said SCR input terminal and said SCR output terminal and permitting said current sensitive latching circuit to maintain said SCR circuit portion in said conductive state, as long as current flowing through said SCR circuit portion is greater than a predetermined value.

7. A silicon controlled rectifier device comprising:

a voltage comparator;

an SCR circuit portion comprising an SCR circuit portion switching control terminal in electrical communication with said voltage comparator; and a current sensitive latching circuit in electrical communication with said SCR circuit portion, said voltage comparator controlling the switching of said SCR circuit portion into a conductive state, in response to a voltage applied to said voltage comparator, thereby permitting current to flow through said SCR circuit portion and permitting said current sensitive latching circuit to maintain said SCR circuit portion in said conductive state, as long as current flowing through said SCR circuit portion is greater than a predetermined value.

* * * * *

UNITED STATES PATENT AND TRADEMARK OFFICE
CERTIFICATE OF CORRECTION

PATENT NO. : 5,218,249
DATED : June 8, 1993
INVENTOR(S) : Mark Jordan

It is certified that error appears in the above-indentified patent and that said Letters Patent is hereby corrected as shown below:

In the Abstract, line 7, "the SC portion" should read --the SCR portion--.

Column 4, line 12, "$dI_{jolding}$" should read --$dI_{holding}$--.

Signed and Sealed this

Twenty-fourth Day of May, 1994

*Attest:*

BRUCE LEHMAN

*Attesting Officer*    *Commissioner of Patents and Trademarks*